Figure 1:
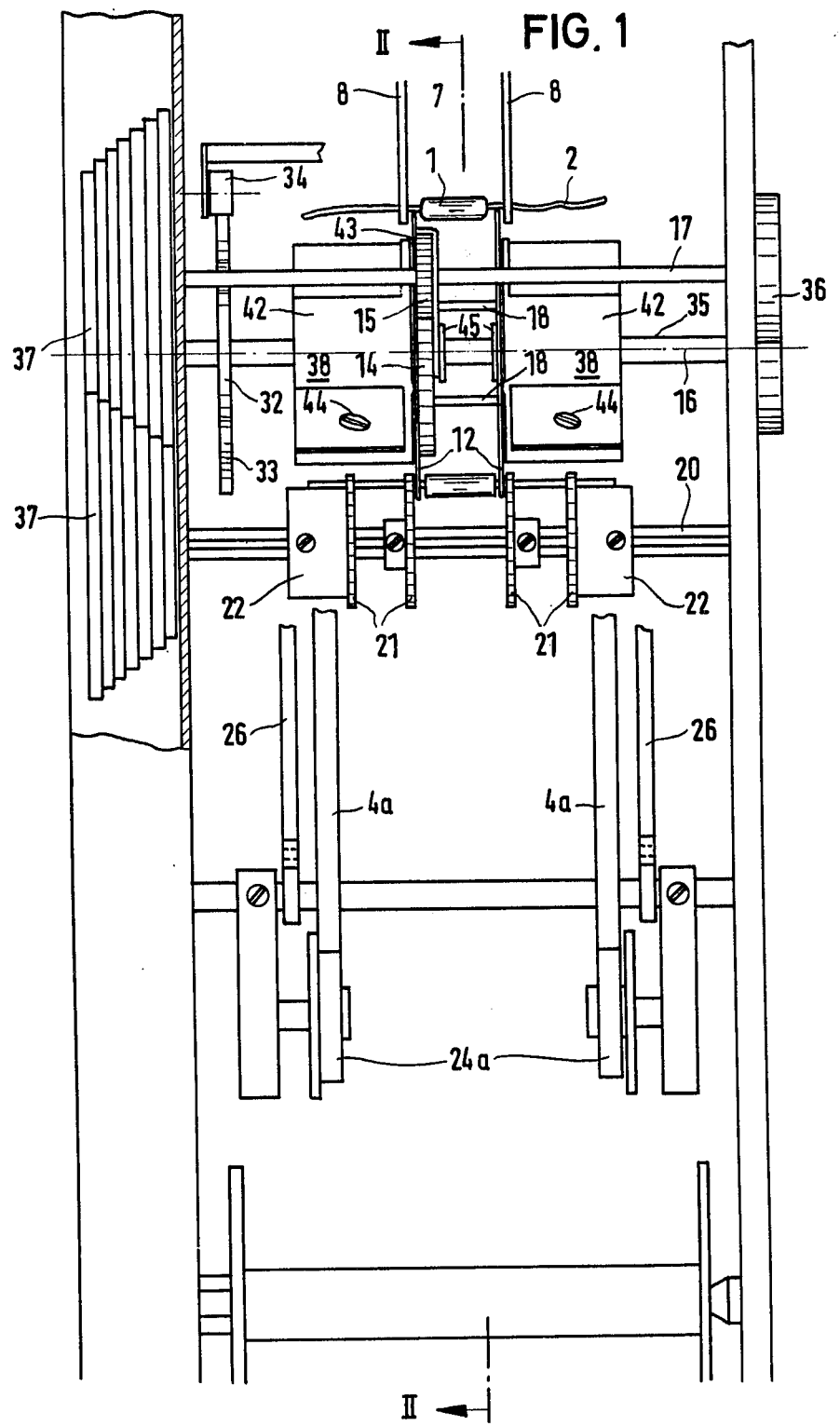

United States Patent [19]

Weresch

[11] 4,279,278

[45] Jul. 21, 1981

[54] APPARATUS FOR STRINGING ELECTRICAL COMPONENTS HAVING TWO ALIGNED CONNECTING WIRES INTO A BELT

[76] Inventor: Thomas Weresch, Greschbachstr. 19, D-7500 Karlsruhe 41, Fed. Rep. of Germany

[21] Appl. No.: 18,502

[22] Filed: Mar. 8, 1979

[30] Foreign Application Priority Data

Mar. 25, 1978 [DE] Fed. Rep. of Germany ....... 2813100

[51] Int. Cl.³ .......................... B21F 1/02; B65B 13/02
[52] U.S. Cl. ...................................... 140/147; 53/591; 53/594; 156/552
[58] Field of Search ...................... 29/33 M; 140/147; 12/29; 156/552; 53/593, 594, 591

[56] References Cited

U.S. PATENT DOCUMENTS

| | | |
|---|---|---|
| 2,885,849 | 5/1959 | Wohlman, Jr. .......................... 53/591 |
| 2,928,452 | 3/1960 | Diggle et al. ...................... 140/147 X |
| 3,421,284 | 1/1969 | Zemek ............................. 156/552 X |
| 3,616,089 | 10/1971 | Zemek ............................. 140/147 X |
| 3,701,233 | 10/1972 | Luckman, Jr. .................a. 140/147 X |
| 3,744,535 | 7/1973 | DuBois ................................. 140/147 |
| 4,142,347 | 3/1979 | Weresca ............................ 53/594 X |

FOREIGN PATENT DOCUMENTS

| | | |
|---|---|---|
| 1906651 | 8/1970 | Fed. Rep. of Germany ........... 140/147 |
| 190998 | 6/1967 | U.S.S.R. .................................. 140/147 |
| 298090 | 12/1971 | U.S.S.R. .................................. 140/147 |

*Primary Examiner*—William R. Briggs

*Attorney, Agent, or Firm*—Craig and Antonelli

[57] ABSTRACT

Apparatus for stringing electrical components into a belt for convenience in handling, packing and despatch to customers, the components having two connecting wires extending in opposite directions and the belt comprising two runs of double adhesive tape to trap the connecting wires and incorporate the components into the belt in ladder-like formation. The components are fed down a guide and released one-by-one by a blocking slide to a transfer device comprising two rotating discs having slots for receiving the connecting wires and being associated, if necessary, with stationary projections for preventing them from falling out. The transfer discs may be associated with specially shaped rollers for straightening the connecting wires. The components then enter the actual belt make-up machine of the apparatus, comprising a pair of toothed wheels, each in two parts whose spacing is adjustable and each associated with a guide roller and a pressure roller. These rollers serve for guiding respective pairs of adhesive tapes, coming from respective reels into position to receive the opposite connecting wires of the components and then to trap them and thereby form the belt. The toothed wheels and the transfer discs are connected by a change-speed gear, which may take the form of a draw-key type (stepped conical or wedge type) gearing, making it possible to achieve easily a wide range of adjustment of the spacing of the components in the belt. Certain other adjustment means and features of the apparatus are described.

12 Claims, 2 Drawing Figures

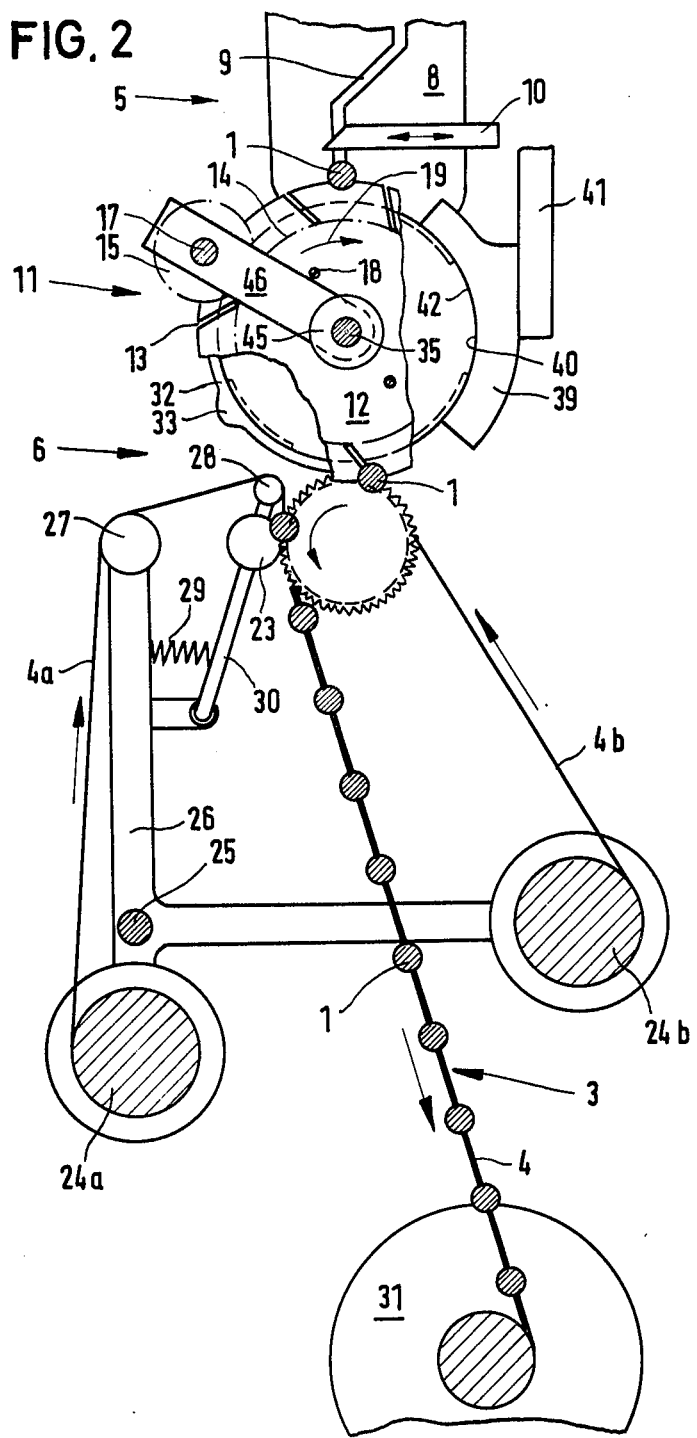

APPARATUS FOR STRINGING ELECTRICAL COMPONENTS HAVING TWO ALIGNED CONNECTING WIRES INTO A BELT

The invention relates to an apparatus for stringing electrical components having two aligned connecting wires into a continuous belt which comprises, for each of said wires of each such component, two adhesive tapes which are unwound from supply reels and secure the connecting wires of successive components between themselves, the apparatus comprising two transporting toothed wheels which are arranged coaxially and with a spacing between them to receive the connecting wires in spaces between the teeth, respective pairs of rollers comprising guide roller and pressure roller associated with the transporting toothed wheels, and a component feed arrangement comprising two transfer discs which are arranged coaxially and with spacing between them and are provided with peripheral slots for receiving the connecting wires, the said discs being adapted to be driven in synchronized rotational movement and being drivingly connected to the transporting toothed wheels, wherein the adhesive tapes are conducted in pairs, with the tapes of each pair overlapping one another, through in each case a gap existing between one of the guide rollers and the associated pressure roller, and are pressed against one another so as to include the connecting wires of the components which have been fed-in by the transfer discs.

Apparatus of this kind are employed for making up into belts passive electrical components in loose form such as resistances, capacitors and diodes. The components are singled out by the component feed arrangement of a type known per se (see German patent specification 25 23 666) and fed to the actual belt make-up device. This comprises essentially the transporting toothed wheels which are mounted on a common shaft so as to rotate therewith and at a spacing corresponding to the length of the components, the connecting wires being received in the gaps between the teeth of the said toothed wheels. At the sides of the transporting toothed wheels which are remote from one another the guide rollers are arranged at a spacing appropriate to the total length of the components (including connecting wires) over each of which guide rollers an adhesive tape is conducted. One further adhesive tape in each case is introduced in such a manner, by way of the pressure rollers associated with the guide rollers, that as a result the connecting wires are secured between the adhesive tapes which become stuck to one another. In order to make it possible in a simple manner to adapt to different components, it has already been proposed (see U.S. Pat. No. 4,142,347) to arrange the transporting toothed wheels and the guide rollers on a common shaft so as to have a variable spacing, to arrange the supply reels for the two adhesive tapes which are to be connected to one another each on a support, and to make the two supports adjustable relatively to one another in the direction of the shaft axis.

Also known (from actual practice) is an apparatus of the type discussed hereinbefore wherein for controlling the spacings of the components from one another in the belt which is produced there is interchangeably secured on the shaft of the transfer discs at the outer side of the housing a cam disc by means of which a trap controlling the passage of the components is controlled. Corresponding to the number of control cams of the cam disc it is possible to vary the frequency with which the trap is opened, and the density at which the components are packed on the belt is modified accordingly. However, in actual practice the variation of packing density which can be achieved in principle in this way is not completely satisfactory. For one thing it is necesary to adapt the number of control cams on the cam disc to the number of reception slots of the transfer discs. As a result only specific discrete values of packing density can be set, while at other values there is no ordered transfer of components. Consequently semi-continuous adjustment of the packing density on the belt is not possible with this known apparatus. Also the control arrangement in this known apparatus is such that, starting from the maximum throughput of components, if each reception slot in the transfer discs is occupied, a changeover to larger component spacings on the belt results in a reduction in throughput, since, with a constant rotational speed for the transfer discs, it is no longer possible to use all the reception slots. Consequently, when the component spacings are larger, the capacity of this known apparatus decreases proportionally.

The invention has as its object to develop an apparatus of the type initially herein described further in such a manner that while using the apparatus to the optimum capacity it is possible to adjust substantially optionally over a wide range of component spacings on the belt.

This object is achieved according to the present invention in that the transporting toothed wheels and the transfer discs are connected by a change-speed gear. In the known apparatus of the kind described an increase in the spacing of the components on the belt, i.e. a reduction in packing density, while keeping the rotational speed relationships the same, is achieved by reducing the frequency of transfer of the components, in other words the component feed arrangement is no longer fully utilized. A starting point of the invention is the realization that in actual practice the capacity of the apparatus is limited not by the belt make-up operation but by the component feed arrangement. In an apparatus according to the present invention, by occupying each reception slot in the transfer discs the capacity of the component feed arrangement is always used to the optimum extent. Differing component spacings on the belt are achieved by suitably adjusting the rotational speed of the transporting toothed wheels and therefore the speed of delivery of the belt by means of the change-speed gear. In the first instance this ensures that the capacity of the apparatus can always be fully utilized. Also when determining packing density there are no longer the restrictions which result from the relatively small number of reception slots in the transfer discs. The particular setting of the transmission ratio of the change-speed gear makes it possible to adjust the intended packing density over a wide range and with a good standard of accuracy limited only by the spacing of the teeth in the transporting toothed wheels.

Since by use of the present invention it becomes possible, whilst occupying each reception slot in the transfer discs, to vary the packing density and therefore always to use fully the capacity of the apparatus, it is advantageous to arrange the rotational speed of the transfer discs to be selectable but substantially constant. With an apparatus according to the invention the control of the supply of components can be effected as in the case of the known apparatus with a control disc which is in driving connection with the transfer discs and which comprises control cams distributed uniformly at its periphery for operating for example a blocking slide provided in the component feed arrangement. Optimum capacity utilization is achieved if the relationship between the number of control cams and the number of reception slots is in inverse ratio to the relationship between the rotational speed of the control disc and the rotational speed of the transfer discs.

In a particularly simple construction which at the same time makes adjustment possible over a very wide range with very little cost, the change-speed gear can comprise change wheels such as are conventional for example with machine tools. A further possibility which is characterized by particularly simple actuation is to construct the change-speed gear as a draw-key type (stepped conical or wedge type) of gearing.

It will usually be a production aim, in order to keep down the costs of packing and shipping, etc, not to make the spacings of the components in the belt larger than is absolutely necessary. In this respect the apparatus according to the invention has been found particularly advantageous since it makes it possible to approach relatively precisely a given value of packing density. However, the problem occurs that in many cases the connecting wires are not straight and coaxial but instead have become bent in a disorderly fashion. This makes it necessary to select the component spacings to be larger than would be absolutely necessary under favorable conditions, so that the advantageous properties of the apparatus according to the invention could not be fully utilized. In order to avoid such disturbances because of bent connecting wires it is proposed according to a feature of the invention, in a further development which can also be carried out independently of the measures described hereinbefore, that at the sides of the transfer discs which are remote from one another and coaxially therewith there are provided straightening rollers whose periphery intersects the reception slots, that the straightening rollers are adapted to be driven in rotational movement at twice the rotational speed of the transfer discs, and that straightening jaws which are stationary and have a pressure application surface concentric with the periphery of the straightening rollers are associated with the straightening rollers. The connecting wires in each case are rolled between the rotating straightening roller and the pressure application surface of the associated straightening jaw and in so doing are directed into a straight situation and coaxial with one another, and of course the width of the straightening roller and straightening jaw corresponds to the length of a connecting wire. Straightening machines of this basic construction are known per se as independent devices. The components are guided through guide discs which are arranged between the straightening rollers and into whose slots the connecting wires are inserted. The speed of travel of the center point of the wire is half as great as the speed of travel of the point of contact between straightening roller and wire. Since the speed of travel of the guide disc at the guide radius has to correspond to that of the center point of the wire and since this guide radius —up the radius of the connecting wire —corresponds to the radius of the straightening roller, the straightening rollers must be driven at twice the rotational speed of the guide discs. Usually the straightening rollers do not operate at their entire periphery but have —in development —projecting zones. These facts are known per se.

Starting therefrom, the invention uses the further realization that the transfer discs can be used at the same timee as guide discs of a straightening device in order in this way to effect both the straightening of the connecting wires and also the making-up of the belt in one and the same apparatus. The aforesaid projecting zones of the straightening rollers can be made wedge-shaped in a manner known per se. This, however, involves a risk that the connecting wires will be pulled out of the component, so that preferably the projecting regions have axially parallel boundaries and are bevelled at their edge which is the leading edge in the direction of rotation.

There are various possibilities available for driving the straightening rollers. Thus, the straightening rollers may be arranged freely on the driving shaft of the transfer discs and be driven thereby through the agency of a planetary gear. The transfer discs in that case are arranged themselves on their driving shaft so as to be integral in rotational movement therewith. However, this arrangement has the disadvantage that a completely rigid connection between the straightening rollers is not provided. On the contrary, these may lead or lag relatively to one another in accordance with the play in their drive system. Because of the considerable transmission ratio between straightening rollers and connecting wires this may result in the wires being twisted and loosened from their bond with the component. For this reason it has been found particularly advantageous to use another arrangement wherein the transfer discs are arranged freely on the driving shaft of the straightening rollers and are connected to rotate with one another and with at least one toothed annulus, the toothed annulus being adapted to be driven by an auxiliary shaft with pinion, which shaft is parallel to the driving shaft and is in driving connection therewith. Each transfer disc can be provided with its own toothed annulus and be driven directly by the auxiliary shaft so that there is no need for a special coupling between the transfer discs. On the other hand if only one transfer disc is directly driven, an additional integrally rotational connection with the other transfer disc is required. It will be clear from the foregoing explanations that a drive transmitting connection between driving shaft and auxiliary shaft is required in such a manner that the transfer discs rotate at half the rotational speed of the straightening rollers. Geometric problems are not caused by the auxiliary shaft and pinion, since these can be arranged so that they do not intersect the part of the periphery of the transfer discs along which the components are transferred. It is also advantageous in this arrangement to arrange the control disc, with which the component element feed arrangement is controlled, on the driving shaft of the straightening rollers so as to be fast in rotation with the said shaft, the number of control cams corresponding to half the number of reception slots in the transfer discs.

Normally the arrangement of the various discs and rollers in an apparatus according to the invention must be capable of adaptation to the dimensions of the electrical components. How this can be effected as regards the transporting toothed wheels is described in the aforesaid U.S. Pat. No. 4,142,347 which can be referred to in this connection. With straightening rollers driven by way of planetary gear units from the driving shaft of the transfer discs, the said rollers can be constructed to be capable of being displaced and clamped in position in a simple manner on the common shaft together with the transfer discs and the planetary gear units. In the other arrangement described, which has the advantage of rigidly coupled straightening rollers, the invention recommends that the straightening rollers are capable of axial displacement and of being clamped in position on the driving shaft, and that the transfer discs are capable of axial displacement and of being clamped in position on a sleeve which is arranged free-running between the straightening rollers on the driving shaft. This also gives a rotationally integral connection between the transfer discs. This arrangement is notable for simple and inexpensive construction, but it allows only limited adjustability because of the limited length of the sleeve, and also it may be found cumbersome that both the transfer disc and also the straightening rollers have to be adjusted. In contrast it is advantageous to use a further constructional form wherein the straightening rollers are also capable of axial displacement and of being clamped in position on their driving shaft, but in this case the transfer discs are mounted to be rotatable on sleeves connected with the straightening rollers, at a given spacing from the corresponding straightening roller. The sleeves can be used at the same time as clamping sleeves for fixing the straightening rollers. The spacing between a transfer disc and the adjacent straightening roller can be adjustable, but usually a close bearing contact will be arranged.

The necessary synchronization between the transfer discs can be effected for example by driving each with its own toothed annulus and pinion by way of the common auxiliary shaft, or arranging that the transfer discs are connected integrally for rotational movement by at least one entrainment pin which is arranged in the two transfer discs eccentrically and in axially parallel manner, and the said pin or pins is/are capable of axial displacement in at least one of the transfer discs, thus allowing variation of spacing at the same time.

If the transfer discs are displaced for adaptation to the dimensions of the components, the pinions on the auxiliary shaft must be also arranged accordingly. This can be achieved in a particularly simple manner if the pinion or pinions on the auxiliary shaft is/are displaceable when a turning action is applied and is/are guided by a guide element which is connected rotatably and so as to be axially nondisplaceable with the sleeve associated with the corresponding transfer disc. In the event of adjustment of the transfer discs with toothed annulus means the pinions are entrained automatically.

The invention will now be described, by way of example, with reference to accompanying drawings, in which:

FIG. 1 shows an apparatus for the stringing of electrical components with two aligned connecting wires into a belt, in front view; and FIG. 2 shows the subject of FIG. 1 in a section taken on II—II.

The apparatus shown in the drawings is used for stringing electrical components, in the present example resistances 1 which comprise two connecting wires 2 which are in alignment with one another, into a belt 3. The finished belt 3 comprises two runs of tape 4, each comprising two adhesive tapes 4a and 4b stuck to one another, between which the components 1 are held like the rungs of a ladder by means of their connecting wires 2. The components 1 are introduced, with connecting wires 2 which may be more or less bent out of position, into a component feed arrangement 5, singled out from one another in this arrangement and fed to the actual belt make-up machine 6.

The component feed arrangement 5 comprises firstly a shaft 7 comprising two cheeks 8 arranged vertically and parallel to one another, in which there is formed a zigzag-shaped guide slot 9. The components 1 slide downwards, the connecting wires 2 being guided in the guide slot 9, and are singled out by a blocking slide 10 arranged in the path of the components 1, there being no need to explain this in detail here. The shaft 7 is followed by a transfer device 11 essentially comprising two transfer discs 12 which are arranged coaxially, with a spacing between them, and are provided at the periphery with reception slots 13 for the connecting wires 2. One of the transfer discs 12 is capable of being driven in rotational movement by means of a toothed annulus 14 connected therewith, a pinion 15, and an auxiliary shaft 17 parallel to the axis 16 of the transfer discs 12. Synchronization of the two transfer discs 12, in the form of an arrangement connecting them to be integral in rotational movement, is provided by two entrainment discs 18 which extend through the transfer discs 12 and the toothed annulus 14 in an axially parallel and eccentric situation, these pins being capable of axial displacement in the two transfer discs 12 and adapted to be clamped in the toothed annulus 14 (by means of screws not shown here).

The components 1 which are fed through the guide slot 9 are deposited individually with their connecting wires 2 in the axially oppositely situated reception slots 13 of the transfer discs 12 and, when the transfer discs 12 rotate in the direction of the arrow 19, are transported from the upper region to the lower region. In this process, the components 1 can be prevented from falling out if necessary by crescent-shaped projections (not shown) of the cheeks 8 which extend along the path of travel of the components 1 at the periphery of the transfer discs 12.

The transfer discs 12 are followed in the lower region by the actual belt make-up machine 6. This comprises substantially two transporting toothed wheels 21 which are arranged coaxially and with a spacing adjacent one another on a common shaft 20, and with each of which there is associated a guide roller 22 and a pressure roller 23. In the illustrated constructional example, the transporting toothed wheels 21 are also divided in a plane perpendicular to the axis into two partwheels which are capable of axial displacement relatively to one another in order to ensure better guiding and supporting of the components 1. The connecting wires 2 of the components 1 deposited in the spaces between the teeth of the transporting toothed wheels 21 are introduced at their ends between the adhesive tapes 4a, 4b, and secured thereby. For this purpose the adhesive tapes 4a, 4b, are drawn off from supply reels 24a and 24b, mounted on a bellcrank lever 26 which can pivot about a pivot-pin 25. The rearward adhesive tape 4b is guided directly on to the guide roller 22. The forward adhesive tape 4a is supplied by way of guide rollers 27 and 28 to the pressure roller 23. The roller 28 and the pressure roller 23 are mounted on a rocking lever 30 which is subjected to spring action at 29. The forward adhesive tape 4a is guided in register with the rear adhesive tape 4b and is pressed-on by the pressure roller 23 under the action of the spring 29. Thus, while the adhesive tapes 4 are led, so as to be situated overlapping one another in pairs, through the gap between the guide roller 22 and pressure rollers 23, the components 1 brought down by the transfer discs 12 are deposited with their connecting wires 2 on the adhesive tape 4b at first and secured between this tape and the adhesive tape 4a on passing the pressure roller 23. The belt 3 which is thus formed is wound on to a drawing-off or take-up reel 31.

The delivering of the components 1 from the guide slot 9 to the transfer discs 12 is effected by appropriate actuation of the blocking slide 10—in such a manner that all the reception slots 13 of the transfer discs 12 are occupied, these being driven at a rotational speed which corresponds to the particular throughput of components which it is desired to achieve. The actuation of the blocking slide 10 is effected by a control disc 32 having control cams 33 which are distributed uniformly over its periphery and which operate the blocking slide 10 by way of a roller 34 and a lever arrangement which is not shown in detail. The control disc 32 is in fact arranged coaxially with the transfer discs 12, but is not rigidly coupled to the said discs and instead is connected in a drive-transmitting manner by way of a shaft 35 which will be explained hereinafter, a pair of gearwheels 36, the auxiliary shaft 17, the pinion 15 and the toothed annulus 14. The arrangement is such that the relationship of number of control cams 33 to the number of reception slots 13 is inversely proportional to the relationship of the rotational speed of the control disc 32 to the rotational speed of the transfer discs 12. In this particular constructional example the number of control cams 33 corresponds to half the number of reception slots 13. Controlling the component feed arrangement 5 in this way ensures that all the reception slots 13 are supplied with components 1.

As can be seen, the spacings of the components 1 in the belt 3 depend on the distance that the adhesive tapes 4 travel between the depositing of two successive components 1. In the illustrated apparatus, a variation in the spacings of the components on the belt 3 is achieved by arranging that the transfer discs 12 are drivingly coupled with a selectable transmission ratio to the transporting toothed wheels. In the apparatus the transfer discs 12 are primarily driven, and with a selectably constant rotational speed. Corresponding to the desired spacing of the components in the belt 3, the rotational speed of the transporting toothed wheels 21, and thus the speed of delivery of the adhesive tapes 4, is modified by modifying the transmission ratio. This is effected with the draw-key type (stepped conical or wedge type) of gearing 37 whereby the transfer discs 12 are drivingly connected (by way of toothed annulus 14, pinion 15 and auxiliary shaft 17) to the shaft 20 of the transporting toothed wheels 21.

FIG. 1 shows in a diagrammatic manner how the components 1 frequently arrive with the connecting wires 2 bent in an irregular manner. In order to produce a belt 3 with components 1 arranged in it in a close sequence and in a uniform manner, the connecting wires 2 have to be straightened before the belt is made up. For this purpose there are provided at those sides of the transfer discs 12 which are remote from one another, and in a coaxial situation relatively to the said discs, straightening rollers 38 the periphery of which intersects the reception slots 13 so that the connecting wires 2 lie on the cylindrical surface of the straightening rollers 38. The straightening rollers 38 are connected to the shaft 35 for rotation therewith and are consequently driven at a rotational speed which is twice that of the transfer discs 12, which has already been explained. Associated with the straightening rollers 38 are stationary straightening jaws 39 which comprise a pressure application surface 40 which is concentric with the periphery of the straightening rollers 38. The straightening jaws 39 are mounted on supporting levers 41 and pressed by powerful springs (not shown) against the generated surface of the straightening rollers 39. Both the straightening rollers 38 and also the straightening jaws 39 consist of a metal support on to which there is applied a resilient but relatively hard rubber layer. Moreover, the straightening rollers 38 have on their operating surface a profiling in the form of projecting regions 42 which are bevelled at their edge which is the leading edge in the direction of rotation (which bevelling is not visible in the drawings) so that the connecting wires 2 are introduced without disturbance between the straightening roller 38 and the straightening jaw 39. The profiling does not quite reach as far as the inner side of the straightening rollers 38, so that the connecting wires 2 are always supported on a narrow rim 43. As they roll between the straightening rollers 38 and the straightening jaws 39 the connecting wires 2 are brought into a straight direction without difficulty.

To adapt to different dimensions of components 1, in the first instance the transporting toothed wheels 21 with guide roller 22 and pressure roller 23 and also the associated adhesive tape guides can be axially adjusted. Also, to adapt to different dimensions of components 1, the straightening rollers 38 are capable of being displaced axially on their driving shaft 35 and clamped in position with screws 44. Connected to the straightening rollers 38 are sleeves (not shown) which each have a collar 45 at their inner sides. The transfer discs 12 are mounted on the sleeves—in such a manner that they can be freely rotated relatively to the shaft 35—and are secured by the collars 45, so that they are adjustable axially at the same time as the straightening rollers 38. The pinion 15 which drives the transfer discs 12 by way of the toothed annulus 14 is arranged to be capable of displacement when a turning action is applied on the auxiliary shaft 17. A guide element 46 is held in such a manner by the collar 45 that it does not hinder the rotation of the sleeve connected with the straightening roller 38. This guide element 46 essentially forms a radial arm which engages about the pinion 15 at the outer side, is adjusted axially together with the straightening roller 38 and in so doing entrains the pinion 15—engagement with the toothed annulus 14 being always maintained. Thus, separate adjustment of the pinion when adapting to different dimensions of electrical components is not necessary.

I claim:

1. Apparatus for stringing electrical components having two aligned connecting wires into a continuous belt in which, for each of said wires of each such component, two adhesive tapes secure the connecting wires of successive components between themselves, said apparatus comprising two transporting toothed wheels which are arranged coaxially with a spacing between them to accommodate said components while receiving said connecting wires in tooth gaps, first and second pairs of rollers each including a guide roller and a pressure roller drivingly connected to a respective one of said transporting toothed wheels, and a component feed arrangement comprising two transfer discs which are arranged coaxially and with spacing between them and are provided with peripheral reception slots for receiving said connecting wires, driving means for driving said transfer discs in synchronised rotational movement with each other at a preselected given rotational speed, change speed gear means connecting said driving means to said transporting toothed wheels for selectively varying the rotational speed of said transporting toothed wheels, and means for supplying said adhesive tapes in pairs, with one tape of each pair over the other tape of that pair, through a gap between one of said guide rollers and the associated pressure roller so that said tapes are pressed against one another with said connecting wires of said components which have been fed-in by said transfer discs disposed therebetween to form said continuous belt.

2. Apparatus according to claim 1, including means for adjusting the rotational speed of said transfer discs so that said speed is constant after once selected and is independent from any change in the rotational speed of said transporting toothed wheels.

3. Apparatus according to claim 1, wherein said component feed arrangement further comprises a blocking slide, and further including a control disc which is drivingly connected to said transfer discs by way of a gear arrangement so as to rotate at a different speed therewith and has control cams distributed uniformly over its periphery for operating said blocking slide, the relationship of the number of control cams to the number of reception slots being inversely proportional to the relationship of the speed of said control disc to the speed of said transfer discs.

4. Apparatus according to claim 1, wherein said change speed gear means is constructed as a draw-key type of gear mechanism.

5. Apparatus according to claim 1, wherein at the sides of the transfer discs remote from one another, and situated coaxially with the said discs, there are arranged straightening rollers the periphery of which intersects the reception slots, means for driving the straightening rollers in rotational movement at twice the rotational speed of the transfer discs, and means for straightening the connecting wires of said components in conjunction with said straightening rollers including stationary straightening jaws having a pressure application surface concentric with the periphery of the straightening rollers.

6. Apparatus according to claim 5, wherein the straightening rollers are arranged freely on a driving shaft connected to the transfer discs and are driven thereby through the agency of a planetary gear.

7. Apparatus according to claim 5, wherein the transfer discs are arranged freely on a driving shaft connected to the straightening rollers and are connected to be integral in rotation with one another and with at least one toothed annulus which is driven in rotational movement by an auxiliary shaft by way of a pinion, the said auxiliary shaft being parallel to the driving shaft and being connected for rotational drive transmission therewith.

8. Apparatus according to claim 7, wherein the control disc is arranged on a driving shaft connected to the straightening rollers so as to be integral in rotation therewith, and the number of control cams corresponds to one-half the number of reception slots in the transfer discs.

9. Apparatus according to claim 7, wherein the straightening rollers are mounted so as to be displaceable axially on a driving shaft, and means for clamping the straightening rollers in position on said driving shaft, the transfer discs being axially slidable and clamped in position on a sleeve which is movable freely between the straightening rollers on the driving shaft.

10. Apparatus according to claim 7, wherein the straightening rollers are displaceable axially on a driving shaft, and means for clamping the straightening rollers in position on the driving shaft, the transfer discs being mounted to be rotatable on sleeves connected with the straightening rollers, each at a predetermined spacing from the corresponding straightening roller.

11. Apparatus according to claim 7, wherein the transfer discs are connected for rotation together by means of at least one entrainment pin extending through the transfer discs eccentrically and in axially parallel manner and said pin being capable of axial displacement in at least one of the transfer discs.

12. Apparatus according to claim 7, wherein said pinion is capable of being displaced on the auxiliary shaft by a turning action and is guided by a guide element connected rotatably and axially non-displaceably with the sleeve associated with the corresponding transfer disc.

* * * * *